United States Patent [19]
Jackson et al.

[11] Patent Number: 5,197,086
[45] Date of Patent: Mar. 23, 1993

[54] HIGH SPEED DIGITAL CLOCK SYNCHRONIZER

[75] Inventors: Frederick E. Jackson, Apalachin; Bernard J. Letner, Johnson City; Nhiem T. Nguyen, Endicott, all of N.Y.

[73] Assignee: International Business Machines Corporation, Armonk, N.Y.

[21] Appl. No.: 636,632

[22] Filed: Dec. 28, 1990

[51] Int. Cl.[5] ............................................. H03D 3/24
[52] U.S. Cl. ................................. 375/119; 375/120; 328/2
[58] Field of Search ............... 375/106, 108, 119, 120; 328/63, 72, 155

[56] References Cited
U.S. PATENT DOCUMENTS

| | | | |
|---|---|---|---|
| 4,677,648 | 6/1987 | Zurflush | 375/120 |
| 4,841,551 | 6/1989 | Avaneas | 375/119 |
| 4,852,124 | 7/1989 | Raucci | 375/120 |
| 4,972,444 | 12/1990 | Melrose et al. | 375/119 |
| 5,022,056 | 6/1991 | Henderson et al. | 375/119 |

Primary Examiner—Curtis Kuntz
Assistant Examiner—T. Ghebretinsae
Attorney, Agent, or Firm—John S. Gasper

[57] ABSTRACT

A synchronization system for locking a data input signal to a local clock uses the data input signal to provide the timing for capturing phase waveforms generated by a delay element string and a local oscillator. A transition detector generates bit patterns which correspond to a captured phase waveform which is in synch with the data input signal. The bit pattern of the captured in synch waveform is stored in a storage device under control of window detection and control logic also timed by the data input signal. The control logic stores a new bit pattern of a new phase waveform when the window detection logic determines that the new bit pattern is outside a 2-bit window and then selects the new phase waveform correponding to the new bit pattern for clocking the data input signal if the new bit pattern hasn't changed after N consecutive cycles of the data input signal.

9 Claims, 5 Drawing Sheets

N CONSECUTIVE TRANSITIONS AT "PHASE + 1":
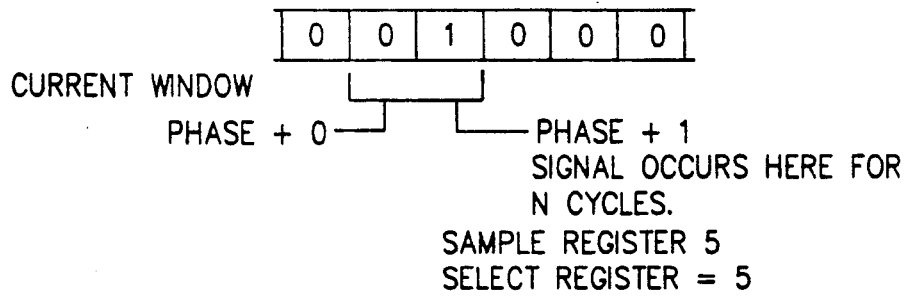
SIGNAL OCCURS HERE FOR N CYCLES.
SAMPLE REGISTER 5
SELECT REGISTER = 5
CAUSES WINDOW TO MOVE:
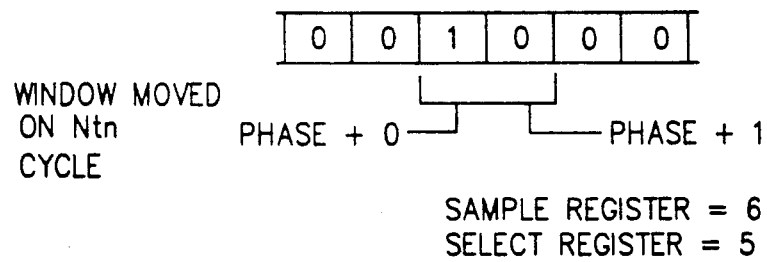
SAMPLE REGISTER = 6
SELECT REGISTER = 5
FIG.5
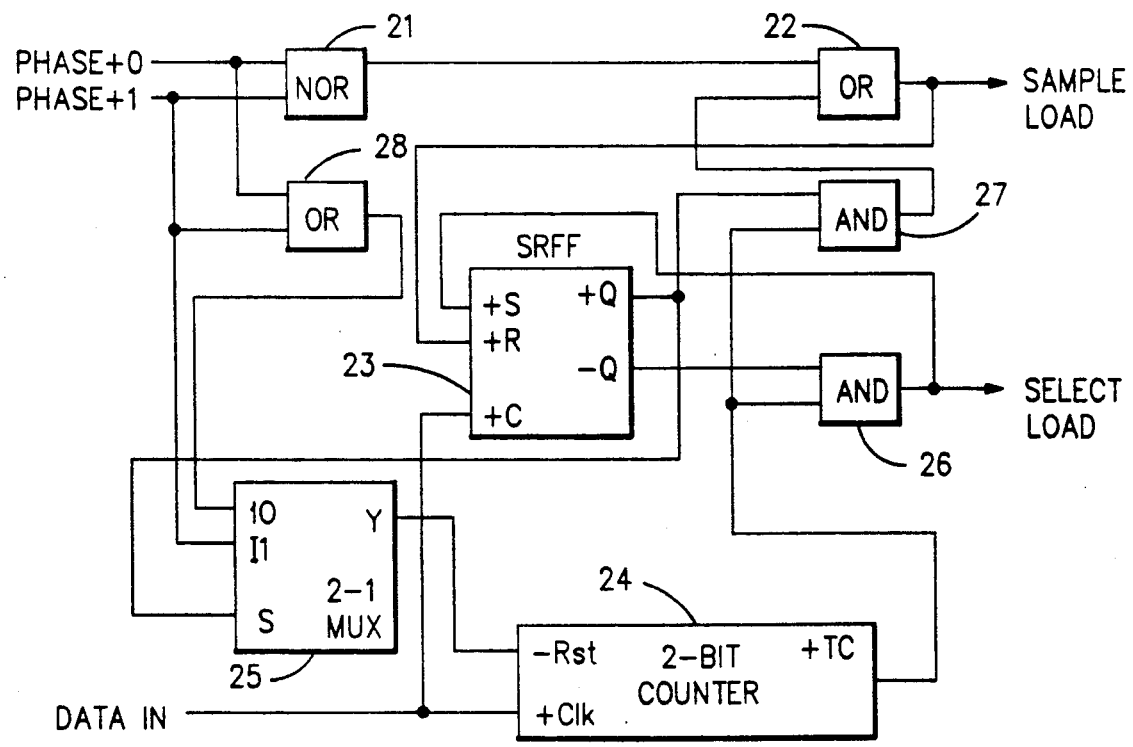
FIG.6

HIGH SPEED DIGITAL CLOCK SYNCHRONIZER

FIELD OF THE INVENTION

This invention relates to synchronizing a local clock signal with incoming data and particularly synchronizers using phase-locked loop devices. The invention is especially adapted for use in data bus devices used in data communications systems.

BACKGROUND OF THE INVENTION

A variety of means and techniques are known for generating a local clock signal by locking to an incoming data signal. In U.S. Pat. No. 4,677,648 of Zurfluh a digital phase locked loop is disclosed wherein a chain of delay elements implements phase offset detection and clock signal phase shifting. The system requires continual estimation of the number of delay elements in a delay element string for a delay time equal to one period of the local clock and a look-up table is required to correct the phase offset to a phase selection value.

In U.S. Pat. No. 4,868,514 of Azevedo et al a digital phase locked correction loop is reset by subtracting one local clock cycle whenever the buildup of successive delay increments added to the system clock equals a full local clock cycle.

In U.S. Pat. No. 4,972,444 of Melrose et al, a digital phase locked device includes registers, triggered during successive selection cycles by a clock sequence generator, which trap the states of waveforms supplied by a delay element string. A transition detector detects transitions in the trapped waveforms and provides output bit patterns corresponding with the clock position. The system provides means for switching from a startup mode, which identifies a window and selects a bit pattern within the window, to a locked mode, in which bit patterns are continuously monitored for positioning within the window, to an unlocked mode and return to the startup mode when error logic indicates consecutive errors due to successive bit patterns that are outside the window. The system of Melrose et al also uses the clock sequence generator for generating signals defining a selection cycle during which the various other operations are performed.

While the prior devices operate satisfactorily, they are too slow for certain high speed serial data buses such as fiber optic buses where a short preamble is used. To be fast enough for such an application, the clock recovery circuit must be able to lock on to the incoming serial data stream as fast as possible. Specifically, it was desired that the circuitry be able to lock onto the binary serial data stream within seven rise time transitions. In addition to the initial synchronization, the circuit must also track and adjust the clock during the reception of the message frame. Most digital PLLs are slow and require at least 10 bit transitions of the incoming data to lock phase with the local clock. Prior PLL implementations employ elaborate clock selection algorithms and complex control circuitry. The design must utilize an all digital technique which is independent of the implementation technology.

SUMMARY OF THE INVENTION

The invention provides a synchronization system for locking a data input signal and a local oscillator without requiring look-up tables, resetting the local oscillator by subtracting clock cycles, or by using a clock sequence generator for producing a selection cycle. In addition, mode switching to lock onto a changed bit pattern is eliminated.

Basically, the invention provides a synchronization system by using the data input signal to provide the timing to capture phase waveforms generated by a delay element string and the local oscillator. A transition detection means generates bit patterns which correspond to a particular phase waveform which is in synch with the data input signal. A selection means comprises storage means for storing a bit pattern from said transition detection means and means for selecting the corresponding in-synch waveform to the data input signal. The selection means further includes window detecting means which determines whether bit patterns from the transition detection means are the same or different from a stored bit pattern. A control means, operating in response to the window detecting means and timed by the data input signal, controls the loading of the storage means whenever the window detecting means indicates a change in a bit pattern from the transition detection means from that first stored in the storage means. The control means includes first means responsive to said window detecting means and said data input signal for first storing a second bit pattern determined by said window detecting means to be different from said first bit pattern in said storage means and second means operable for locking said data in signal and the phase corresponding to said second bit pattern after said window detecting means determines that a predetermined plurality of consecutive bit patterns from said detection transition means correspond with said second bit pattern in said storage means. The synchronizing system further includes encoder means operable in response to the transition detection means which identifies the lowest numbered phase of the waveforms which is in synch with the data input signal. Thus multiple waveform selection is eliminated, error detection is unnecessary, clock sequence generation is unnecessary, mode switching with lock and unlocking is not required and the system can be readily designed with high density circuit devices.

The foregoing and other features and advantages of the invention will be apparent from the following more particular description of the best mode embodiment of the invention as illustrated in the accompanying drawings.

BRIEF DESCRIPTION OF THE DRAWINGS

FIGS. 3-5 are schematics for explaining the operation of the logic blocks of FIG. 1.

FIG. 6 is a schematic block diagram of the control state engine logic of FIG. 1.

DETAILED DESCRIPTION OF THE INVENTION

Figure 1:
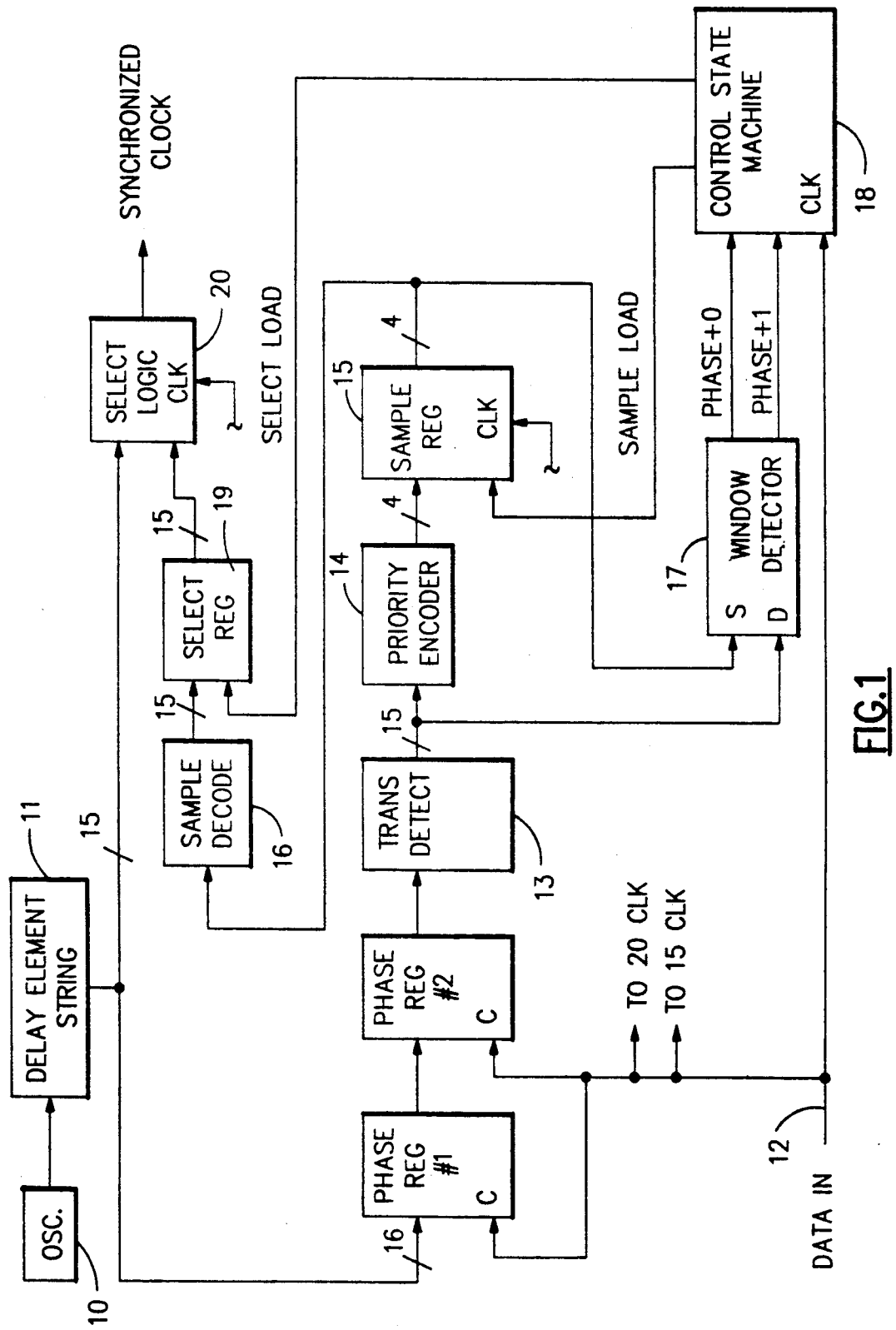
FIG. 1 is a schematic block diagram of a digital synchronizer device embodying the invention.
Figure 2:
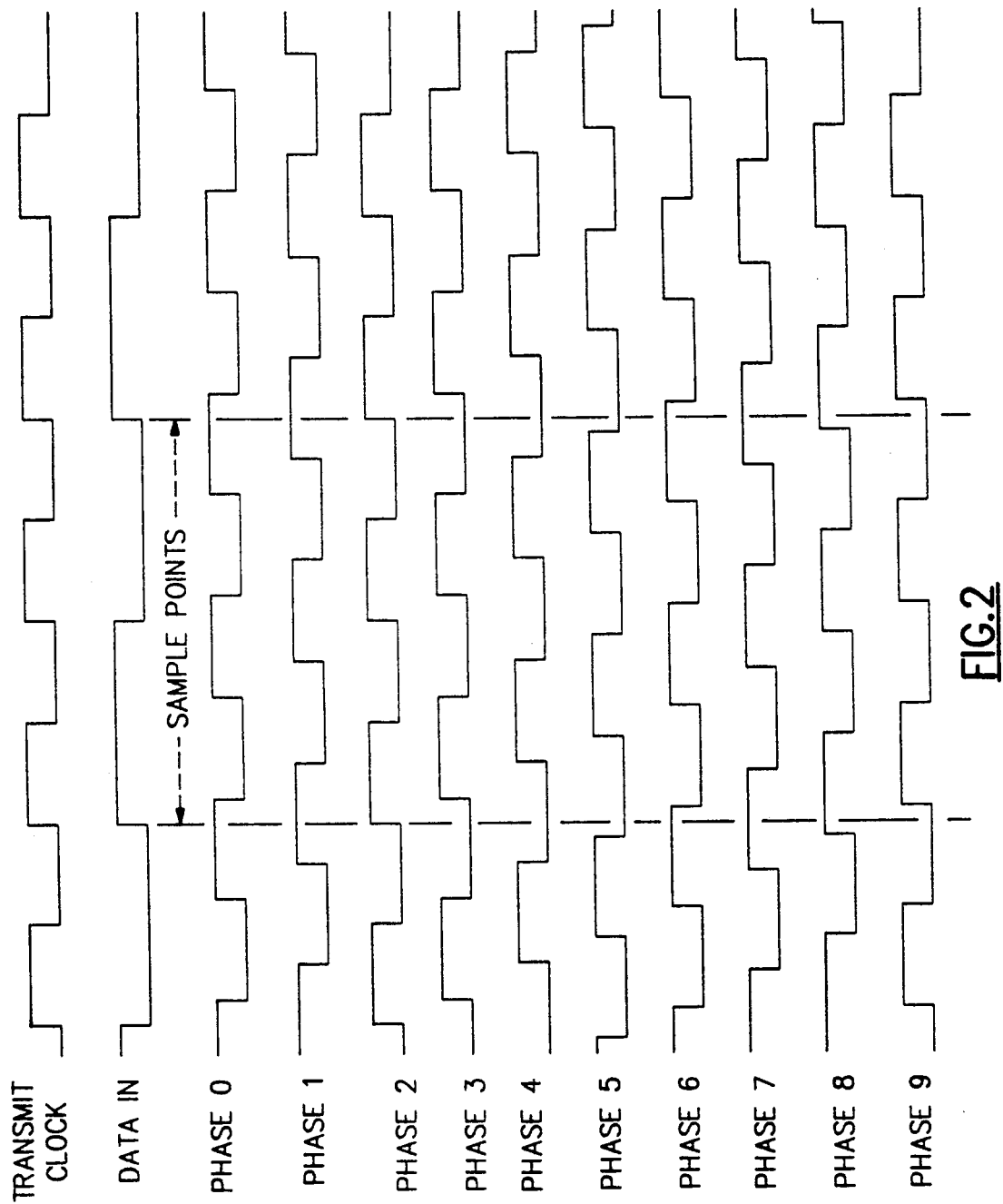
FIG. 2 is a timing chart for explaining the operation of the Delay element string portion of FIG. 1.

As seen in the schematic diagram of FIG. 1, a high speed synchronization system includes a local oscillator 10 connected to a delay element string 11 which generates a sequence of delayed clock phases as seen in FIG. 2. Each clock phase produced by the delay element string 11 serves as an input to the phase registers #1 and

2. When phase register #1 is clocked by the incoming data signal on line 12, it captures the state of the clock phases produced by delay element string 11. The data is transferred to phase register #2 before it is operated on so as to eliminate metastability. Clock phases which are in synch with the incoming data signal on line 12 correspond to the bit positions of 1 to 0 (or alternatively 0 to 1) transitions in phase register #2. These transitions in phase register #2 are located by the transition detector 13.

The selection means for determining when to select a clock phase as the Synchronized Clock is implemented by a priority encoder 14, a sample register 15, a sample decoder 16, a window detector 17 and a control state machine (CSM) 18.

The following is more detailed description of each element of the high speed digital clock synchronizer.

Delay Element String

The delay element string 11 comprises a plurality of logic gates connected serially where the output of each stage is delayed by the previous stage. The total delay time through delay element string 11 must be greater than one period of the local oscillator 10. Enough delay must be present to insure that at least a single 1 to 0 (or 0 to 1) transition in phase register #2 can be detected by the transition detector 13. The delay element string 11 consists of a series of 16 delay stages, with the output of each stage made available to phase register #1 and the final selection logic. Thus a sequence of 16 delayed clock phases as seen partially in FIG. 2 is produced with each phase separated from the next by the delay time associated with one delay stage. The function of the clock selection is to choose which of these clock phases is in sync with the incoming data signal, Data In.

Phase Registers

The phase registers #1 and #2 are 16 bits wide to correspond to the number of phases of delay element string 11. When phase register #1 is clocked by the rising edge of the incoming data signal on line 12, it captures the states of the 16 clock phases produced by the delay element string 11. The phase captured in data phase register #1 is clocked into phase register #2 by the same rising edge of the incoming data signal Data In before being operated on to eliminate metastability. Thus the two phase registers operate essentially in pipeline fashion.

Transition Detector

Figure 3:
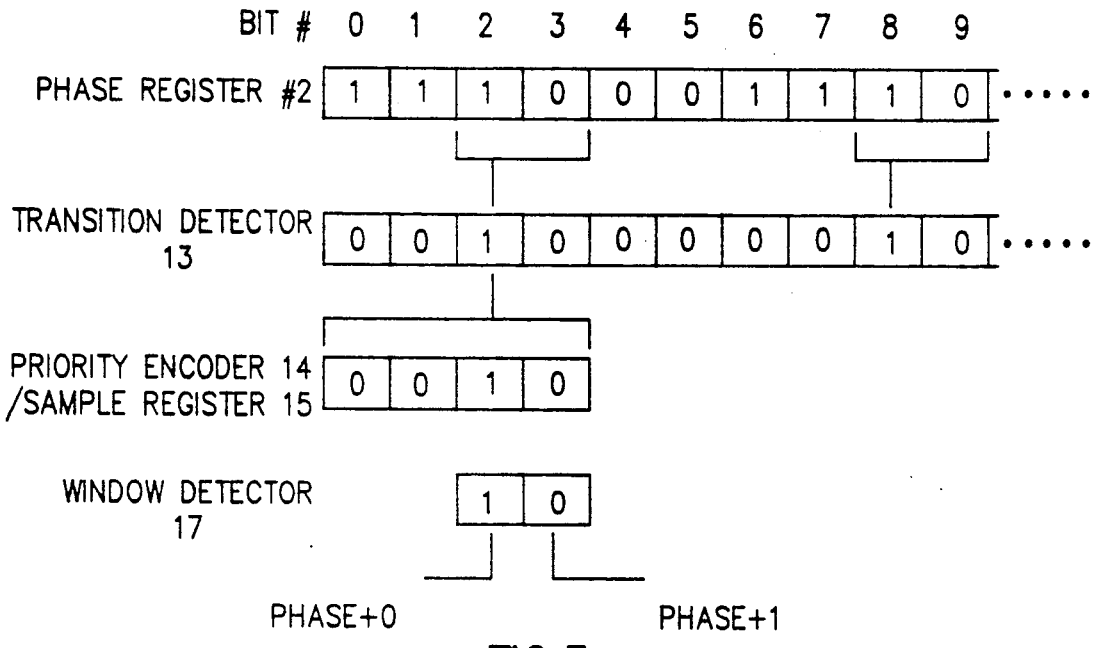

Transition detector 13 consists of combinational logic circuitry which detects 1 to 0 transitions in phase register #2. These transitions indicate which of the clock phases produced by the delay element string 11 are in phase with the incoming data signal on line 12. Transitions are detected by logically ANDing each bit in phase register #2 with the complement of the next higher order bit (+BIT00 AND −BIT01, +BIT01 AND −BIT02 etc.) as is well known. A logic 1 at the output of any AND gate thus indicates a 1 to 0 transition between the two bits being examined. Thus, as seen in the example of FIG. 3, transition detector 13 identifies two stages, 2 and 8, where a 1 to 0 transition occurs in register #2. Note that the transition detector 13 has only 15 bits of output since there is nothing to compare +BIT15 of phase register #2 with. The output of the transition detector 13 goes to priority encoder 14 and the D input of window detector 17.

Priority Encoder

The priority encoder 14 consists of combinational logic circuitry which converts the 15-bit output of the transition detector 13 into a 4-bit binary number for the purpose of specifying the lowest numbered (i.e. the closest to 0) clock phase that is in synch with the incoming data signal on line 12. For example, as seen in FIGS. 2 and 3, the Phase 2 rise time is in phase with the rise time of the Data In signal and the encoded value produced by priority encoder 14 for storage in sample register 15 comprises the four bits (0010) which identify phase 2. Thus priority encoder 14 eliminates multiple logic 1 outputs from the transition detector 13 and allows the sample register 15, which is connected to the output of priority encoder 14, to be implemented as a 4-bit- register thus saving on number of circuit elements required by the logic.

Sample Register/ Sample Decoder

The sample register 15 is loaded from the priority encoder 14 under control of the Control State Machine 18. Its outputs are used as the Select (S) inputs to the multiplexers which make up the window detector 17 and are fed to the sample decoder 16. All decisions made by CSM 18 are with respect to the last value stored in the sample register 15. The sample decoder 16 consists of combinational logic which performs a 4-to-15 bit decode function. Its output is loaded into the select register 19 under control of CSM 18 for ultimate use in synchronizing the selected phase of delay element string 11 and the Data In signal on line 12.

Select Register/Selection Logic.

Select register 19 is a 15-bit register specifying which of the clock phases produced by the delay element string 11 has been chosen as the Synchronized Clock. When there is no activity on the incoming data signal line 12, select register 19 will be cleared so that no clock phase is selected (the initial condition). The selection logic 20 is simply a 15-to-1 multiplexer whose output is the Synchronized Clock signal that locks the local oscillator 10 to the incoming data signal Data In.

Window Detector

Window detector 17 comprises a pair of 15-to-1 multiplexers whose data inputs come from the transition detector 13 and whose select inputs are the encoded value stored in sample register 15. It provides 2 bits, phase +0 and phase +1, of output to CSM 18. One bit, Phase +0, corresponds to the transition detector output bit specified by sample register 15. The other output bit, Phase+1 corresponds to the next higher output bit of transition detector 13. If, for example, the value stored in sample register 15 is binary 3 (i.e. 0011), the phase +0 output will select bit 3 of transition detector 13 output and the Phase +1 output will be bit 4. Thus a 2-bit window is created around the value in sample register 15. The purpose of the window detector 17 is to first compare the current bit pattern output of transition detector 13 to a previous bit value stored in the sample register 15 and then to enable CSM 18 to make a window change where an out of window condition develops. Other examples illustrating the operation of the window detector 17 for effecting other window changes may be seen by reference to FIGS. 4 and 5.

Control State Machine

Figure 7:
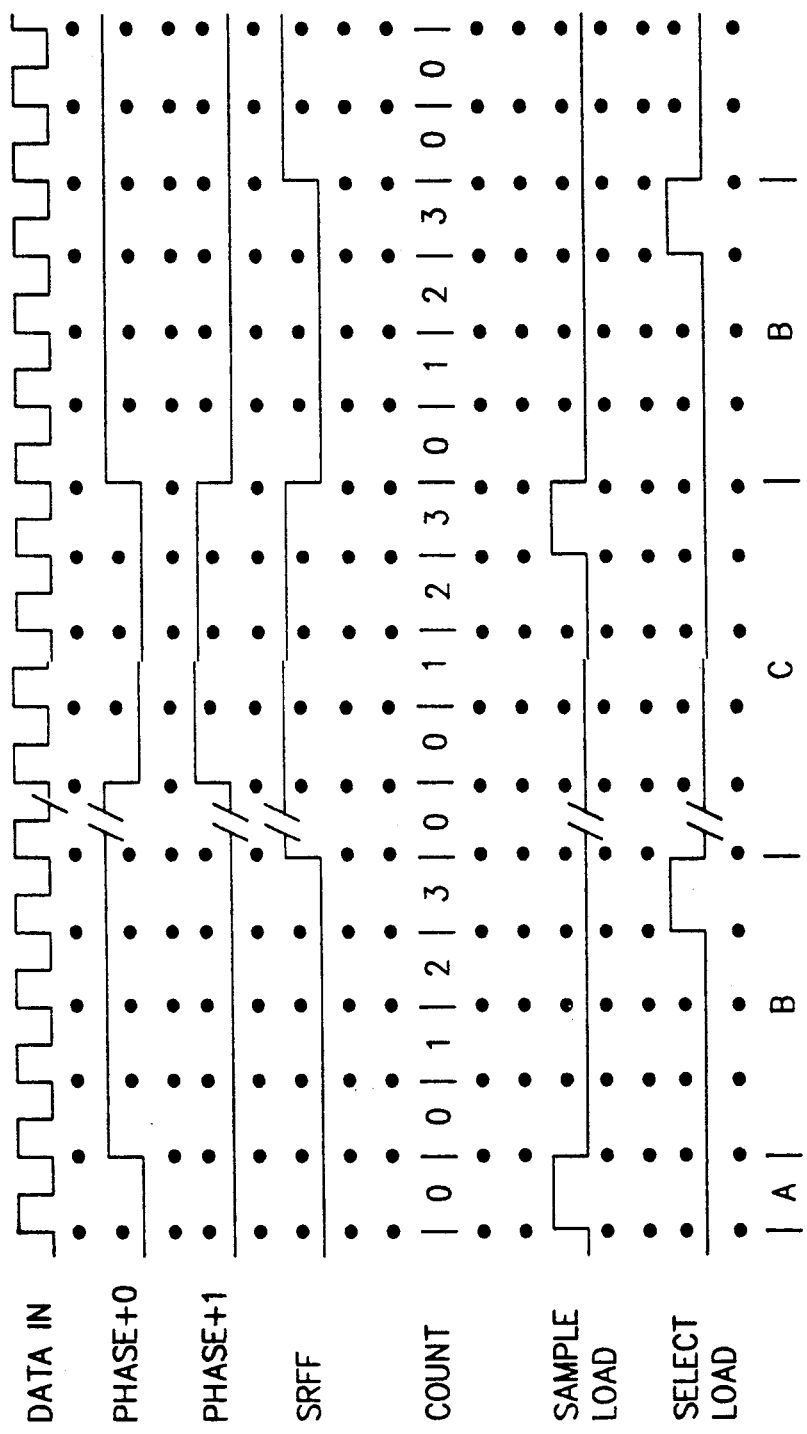
FIG. 7 is a timing chart for explaining the operation of the Control State Machine of FIG. 6.

CSM 18 comprises logic circuitry for implementing the algorithm for selecting a clock phase. This algorithm runs continuously in the presence of activity on the incoming Data In signals on line 12. An advantage of this invention is that there is no difference in operation between picking an initial clock phase and changing clock phases to track with oscillator drift. CSM 18 has only two inputs; the PHASE +0 and PHASE +1 outputs of window detector 17, and two outputs; the Sample Load signals to sample register 15 and the Select Load signal to select register 19 which are clocked by the Data In signal on line 12. The algorithm to determine when to load the sample register 15 and select register 19 has three major components which, as seen in FIGS. 6 and 7 are as follows:

A. Load Sample Register IF (PHASE+0)+(PHASE+1)=0

Figure 4:
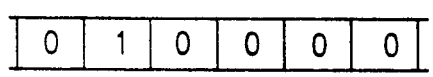

The A condition, when generated by window detector 17, specifies that the in synch clock phase from delay element string 11, currently identified by the bit pattern output from transition detector 13, is outside the window defined by the bit value contained in sample register 15 (e.g see also FIG. 4). This condition can occur for either of two reasons:

1. The incoming Data In signal on line 12 has just become active after having previously been inactive (thus no prior clock phase is selected). The value in the sample register 15 may be leftover from a previous transmission and is therefore unrelated to the current transmission.

2. The incoming Data In signal has been active for an extended time and the transmit oscillator is slightly faster than the local oscillator 10. Thus the input data signal leads the local oscillator signal or "drifts to the left".

B. Load Select Register IF (PHASE+0)+(PHASE+1)=1 For N Cycles

The B condition specifies that for N consecutive Data In signal cycles, the output of transition detector 13 is within the window of sample register 15. The specified clock phase is then selected by CMS 18 as the Synchronized Clock output from select register 19 through selection logic 20. It is necessary to set up a window around sample register 15 in order to deal with the condition where the "ideal" clock phase is midway between two output phases of delay element string 11. In that case it may not always be possible to get N consecutive samples of the same phase.

It is necessary to insure that N consecutive samples are within the window to account for random jitter on the output of an optical bus receiver when the power level of the optical input is low. A new clock phase must not be selected in response to jitter as this would result in an unacceptable bit error rate. The value chosen for N is a trade-off between immunity to jitter (a higher value) and quick synchronization (a lower value). A value of N=3 was chosen as the highest value that could be tolerated in a fiber optic bus while still achieving synchronization within the desired 6 bit times (i.e. 7 rise transitions). A value of N=2 could also be used to achieve quicker synchronization; however it might be at the price of sacrificing some immunity to jitter. N could be a higher number than 3 when the same operating parameters dictated by an optic bus are not required.

C. Load Sample Register IF (PHASE+1)=1 For N Cycles

The C condition can occur when the incoming data signal on line 12 has been active for an extended time and the transmit oscillator is slightly slower than the local oscillator 10. The Data In signal on line 12 generated by the Transmit Clock of the transmitter oscillator (not shown) lags behind the local oscillator 10 or "drifts to the right". Once the new window value from priority encoder 14 is loaded into sample register 15, N consecutive samples within the new window will cause select register 19 to be loaded as in B above.

As can be seen in FIG. 6, part A above is implemented by CMS 18 if both the PHASE+0 and PHASE+1 inputs from window detector 17 to NOR gate 21 are Logic 15 ut of NOR gate 21 is a Logic 1 which 0, then the output of NOR gate 21 is a Logic 1 which activates the Sample Load signal through OR gate 22 thereby causing the output bit value of priority encoder 14 to be loaded in sample register 15 as previously described. CSM 18 then changes state for counting N consecutive Data In signal cycles in accordance with either Part B or C.

Part B and C above are implemented in CSM 18 via Set-Reset Flip-Flop (SRFF) 23 and 2-bit binary counter 24 both of which are clocked by the Data In signal on line 12. SRFF 23 determines whether counter 24 is counting consecutive cycles of PHASE+0 +PHASE+1=1 (i.e. Part B above) or rather PHASE+1 =1 (i.e. Part C above) by controlling the reset -Rst input to counter 24 through a 2-1 multiplexer 25. If counter 24 reaches the preset count, e.g. the binary value N=3 as previously mentioned, the terminal count +TC output of counter 24 will be a logic 1. In that case, depending on the state of SRFF 23, either a SELECT LOAD signal will be activated through AND gate 26 or the SAMPLE LOAD signal will be activated through AND gate 27 and OR Gate 21. As seen in FIG. 6, SRFF 23 is reset by a SAMPLE LOAD signal from OR gate 21 which results in reverse switching the +Q and −Q outputs to disable AND gate 27 and enable AND gate 26. SRFF 23 is set by a SELECT LOAD signal from AND gate 26 thereby enabling AND gate 27 and disabling AND gate 26. When set, the +Q output of SRFF 23 enables the I1 input of 2-1 multiplexer 25 to gate Phase+1 signals from window detector 17 through the Y output to -Rst input of counter 24 which are then clocked into counter 24 by the leading edge of the Data In signal on line 12. When reset by a Sample Load signal from OR gate 22, SRFF 23 enables the I0 input of 2-1 multiplexer 25 to pass Phase+0=1 or Phase+1=1 signals from window detector 17 via OR gate 29 to be clocked into counter 24.

A typical operational sequence of CSM 18 is illustrated by FIG. 7. At startup, the first output from window detector 17 to CSM 18 is outside the window so sample register 15 is loaded per Part A above and with counter 24 set at zero, SRFF 23 is reset and 2-1 multiplexer 25 is set to enable input 10 to gate Phase+0=1 or Phase+1=1 from OR gate 29 to counter 24, AND gate 27 is disabled and AND gate 26 is enabled to gate a Select Load signal from counter 24. The next three samples are inside the window as a result of the PHASE+0 output from window detector 17 being a logic 1 so select register 19 is loaded by counter 24 per part B.

SRFF 23 is now set by the Select Load signal from AND gate 26 causing multiplexer 25 to be set to enable input Il for Phase+1 signals from window detector 17, AND gate 26 to be disabled and AND gate 27 enabled to gate an output from counter 24.

Subsequently, the Data In Signal "drifts to the right" (as indicated by PHASE+1 input to CSM being a logic 1). Multiplexer 25, being set at Il, gates Phase+1=1 signals to -Rst input of counter 24 which, after three samples, sends an output signal from +TC through AND gate 27 to OR gate 22 which produces a Sample Load signal so that sample register 15 is reloaded per Part C. After three more samples are taken that are inside the new window, select 19 19 is reloaded per part B. Such operation continues as long as DATA IN is active in order to stay in synch with the incoming signal.

Thus it will be seen that an improved High Speed Synchronizer which is more simple has been provided which operates to lock onto a local clock signal more rapidly, i.e. in fewer transitions, and permits locking to occur more easily during data transmission. Because the system comprises digital devices throughout, circuit integration is readily produced regardless of the technology involved and which could readily be implemented in high density circuit technology such as VSLI where mass production makes reduction of the cost possible.

While the invention has been particularly shown and described with reference to a preferred embodiment, it will be understood by persons skilled in the art that various changes in form and details may be made therein without departing from the spirit and the scope of the invention as stated in the following claims.

What is claimed is:

1. In a device for synchronizing a digital data signal with a local clock, the combination comprising
    means for generating a family of delayed digital clock waveforms each clock waveform having a phase separated by a preselected delay time,
    means responsive to a digital data signal for capturing the phases of said clock waveforms,
    transition detection means for detecting transitions in said captured phases of said clock waveforms and providing as outputs bit patterns that correspond directly to phases of said clock waveforms which are in synch with said digital data signal,
    selection means including storage means for storing a first bit pattern output from said transition detection means corresponding to a particular clock waveform which is in synch with said digital data signal,
    window detecting means responsive to said storage means and said transition detection means for determining whether successive bit pattern outputs from said transition detection means are the same or different from said first bit pattern stored in said storage means, and
    control means including first means responsive to said window detecting means and said digital data signal for first storing in said storage means a second bit pattern determined by said window detecting means to be different from said first bit pattern and second means operable for selecting the clock waveform corresponding to said second bit pattern for closing said digital data signal after said window detecting means determines that a predetermined plurality of consecutive bit patterns from said transition detection means correspond with said second bit pattern in said storage means.

2. In a device for synchronizing in accordance with claim 1 which further includes
    encoder means responsive to said transition detection means for specifying the lowest numbered of said clock waveforms which is in synch with said digital data signal for storage of the corresponding bit pattern from said transition means in said storage means.

3. In a device for synchronizing in accordance with claim 1 in which
    said second means of said control means for selecting said clock waveform corresponding with said second bit pattern includes counter means activated by said digital data signal and said window detecting means for counting said predetermined plurality of consecutive bit patterns.

4. In a device for synchronizing in accordance with claim 1 in which
    said means for generating said family of delayed clock waveforms comprises a delayed element string operated by a local oscillator, and
    said window detecting and control means are operable for detecting and selecting an in synch clock waveform as a result of said digital data signal leading or lagging said local oscillator.

5. In a device for synchronizing in accordance with claim 1 in which
    said window detecting means is operable for producing a 2-bit output which defines a window for determining whether said bit patterns from said transition detection means are the same or different from said first bit pattern in said storage means.

6. In a device for synchronizing in accordance with claim 1 in which
    said means for generating a family of delayed clock waveforms comprises a delayed element string operated by a local oscillator, and
    said means for capturing said phases of said waveforms comprises first and second phase registers clocked by said digital data signal
    whereby said phases of said clock waveforms produced by said delay element string are captured by said first register and then transferred to said second register, and
    said transition detection means comprises combination logic for detecting 1 to 0 transitions of said captured phases of said clock waveforms in said second register.

7. In a device for synchronizing in accordance with claim 1 in which
    said window detecting means comprises multiplexer means for producing a 2-bit window signal based on said first bit pattern stored in said storage means, and
    said first and second means of said control means are operable for storing a second bit pattern from said transition detection means and selecting a waveform phase corresponding to said second bit pattern depending on conditions of said 2-bit window signal from said multiplexer means.

8. In a device for synchronizing in accordance with claim 7 in which
    said 2-bit window signals comprise phase+0 and phase+1 signals, and
    said first means of said control means is operable for storing said second bit pattern in said storage means when said phase+0 and phase+1 signals=0 and said second means of said control means is operable when said phase+0 +phase+1 signals=1 for N consecutive cycles of said data in signal.

9. In a device for synchronizing in accordance with claim 8 in which
said first means of said control means is operable for storing said second bit pattern in said storage means when said phase+1 signal=1 for N consecutive cycles of said data in signal.

* * * * *